(12) United States Patent
Wolf et al.

(10) Patent No.: US 11,993,844 B2
(45) Date of Patent: May 28, 2024

(54) PASSIVATION OF SILICON DIOXIDE DEFECTS FOR ATOMIC LAYER DEPOSITION

(71) Applicant: The Regents of the University of California, Oakland, CA (US)

(72) Inventors: Steven Wolf, San Diego, CA (US); Michael Breeden, San Diego, CA (US); Ashay Anurag, La Jolla, CA (US); Andrew Kummel, San Diego, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 16/857,335

(22) Filed: Apr. 24, 2020

(65) Prior Publication Data
US 2020/0340112 A1 Oct. 29, 2020

Related U.S. Application Data

(60) Provisional application No. 62/838,006, filed on Apr. 24, 2019.

(51) Int. Cl.
*C23C 16/455* (2006.01)
*C23C 16/02* (2006.01)
*H01L 21/02* (2006.01)

(52) U.S. Cl.
CPC ........ *C23C 16/45527* (2013.01); *C23C 16/02* (2013.01); *H01L 21/02532* (2013.01); *H01L 21/02554* (2013.01); *H01L 21/0262* (2013.01); *H01L 21/02658* (2013.01)

(58) Field of Classification Search
CPC ......... H01L 21/02658; H01L 21/02343; H01L 21/28562; H01L 21/02312; C23C 16/45527; C23C 16/45525
See application file for complete search history.

(56) References Cited

U.S. PATENT DOCUMENTS

| 9,255,327 | B2 | 2/2016 | Winter et al. | |
|---|---|---|---|---|
| 2003/0198895 | A1* | 10/2003 | Toma | H01L 21/31058 430/314 |
| 2008/0268280 | A1* | 10/2008 | Cho | H05K 3/048 427/259 |

(Continued)

FOREIGN PATENT DOCUMENTS

JP 407221035 * 8/1995

OTHER PUBLICATIONS

S. Sayan et al., J. Vc. Sci. Tech. A 20(2) 2002, 507-512. (Year: 2002).*

(Continued)

*Primary Examiner* — Tabassom Tadayyon Eslami
(74) *Attorney, Agent, or Firm* — Stanek Lemon Crouse & Meeks, PA

(57) ABSTRACT

The present inventive concept is related to methods for passivating an oxide layer and methods of selectively depositing a metal, metal nitride, metal oxide, or metal silicide layer on a metal, metal oxide, or silicide layer over an oxide layer including exposing the oxide layer to a passivant that selectively binds to the oxide layer over the metal, metal oxide, or silicide layer, and selectively growing the metal, metal nitride, metal oxide or metal silicide layer on the metal, metal oxide or silicide layer.

10 Claims, 16 Drawing Sheets

(56) References Cited

U.S. PATENT DOCUMENTS

| | | | | |
|---|---|---|---|---|
| 2013/0078776 | A1* | 3/2013 | Kim | H01L 27/11556 438/268 |
| 2014/0220750 | A1* | 8/2014 | Sohn | H01L 29/7926 438/269 |
| 2016/0365478 | A1* | 12/2016 | Shim | H01L 33/0083 |
| 2017/0012325 | A1* | 1/2017 | Zhu | H01M 4/386 |
| 2017/0104000 | A1* | 4/2017 | Park | H01L 27/11582 |
| 2017/0243759 | A1* | 8/2017 | Jintyou | H01L 29/045 |
| 2017/0342553 | A1* | 11/2017 | Yu | H01L 21/76826 |
| 2019/0164762 | A1* | 5/2019 | Su | H01L 21/76897 |

OTHER PUBLICATIONS

Rong Chen et al, Applied Phys. Lett 56(2005) 191910 (Year: 2005).*

Mi H. Park et al, Langmuir 20, (2004) 2257-2260 (Year: 2004).*

Choi et al., "Selective atomic layer deposition of MoSix on Si (0 0 1) in preference to silicon nitride and silicon oxide," Applied Surface Science, 462 (1008-1016, (2018).

Gall, Daniel, "Electron mean free path in elemental metals," Journal of Applied Physics 119, 085101 (2016).

Guo et al., "Spatial resolution in thin film deposition on silicon surfaces by combining silylation and UV/ozonolysis," Nanotechnology 25, 504006 (2014).

Hashemi et al., "Selective Deposition of Dielectrics: Limits and Advantages of Alkanethiol Blocking Agents on Metal-Dielectric Patterns," ACS Appl. Mater. Interfaces, 8, 33264-33272 (2016).

Knapas et al., "In Situ Studies on Reaction Mechanisms in Atomic Layer Deposition;" Critical Reviews in Solid State and Materials Sciences, 38, 167-202 (2013).

Lecordier et al., "Vapor-deposited octadecanethiol masking layer on copper to enable area selective $Hf_3N_4$ atomic layer deposition on dielectrics studies by in situ spectroscopic ellipsometry," J. Vac. Sci. Technol. A 36, 031605 (2018).

Mikami et al., "Robust self-assembled monolayer as diffusion barrier for copper metallization," Applied Physics Letters, vol. 83, No. 25, Dec. 22, 2003, pp. 5181-5183.

Park et al, "Microcontact patterning of ruthenium gate electrodes by selective area atomic layer deposition," Applied Physics Letters 86, 051903 (2005).

Baik et al., "Comparative study between gas- and liquid-phase silylation for the diffusion-enhanced silylated resist process," Journal of Vacuum Science & Technology B, 9, 3399 (1991).

Baik et al, "Gas phase silylation in the diffusion enhanced silylated resist process for application to sub-0.5 μm optical lithography," Journal of Vacuum Science & Technology B, 8, 1481 (1990).

* cited by examiner

| Contact Angle (Before/After Anneal) | SiO$_2$ | Cu | Co |
|---|---|---|---|
| No Passivation | 33°/36° | 51°/57° | 43°/37° |
| 2 hr TMDS @ 70 C | 86°/- | 55°/55° | 55°/37° |
| 24 hr TMDS @ 70 C | 90°/83° | 75°/42° | 59°/31° |

FIG. 7

PASSIVATION OF SILICON DIOXIDE DEFECTS FOR ATOMIC LAYER DEPOSITION

CROSS-REFERENCE

This application claims the benefit of priority under 35 U.S.C. § 119(e) of U.S. Provisional Patent Application No. 62/838,006, filed Apr. 24, 2019, the content of which is incorporated by reference in its entirety for its teachings.

STATEMENT OF GOVERNMENT SUPPORT

This invention was made with government support under Grant No. HR0011-18-3-0004 awarded by the Department of Defense/Defense Advanced Research Projects Agency (DARPA). The government has certain rights in the invention.

FIELD

A field of the inventive concept is semiconductor device fabrication, in particular, atomic layer deposition (ALD) methods. Example applications of the inventive concept include passivation of silicon dioxide for selective atomic layer deposition of metals, metal oxides and metal silicides. Selective ALD of these materials can be applied to bottom-up fill of metals in vias, as well as deposition of metal oxides for multiple patterning.

BACKGROUND

Currently, for Cu deposition in vias and interconnects, a PVD Ta/TaN layer diffusion barrier is employed. Scaling of this barrier is quite challenging since there is no known ALD method for high conductivity TaN and/or metallic Ta. An alternative is to use a non-metallic film which does not nucleate metal ALD to enable bottom-up fill of vias for decreased resistivity [1]. Self-assembled organic monolayers fulfill this requirement, but the SAM must be chosen which can rapidly form a particle free conformal coating at low temperature and act to effectively suppress the atomic layer deposition of metals, metal oxides, and metal silicides. SAMs such as hexamethyldisilazane and octedecyltrichlorosilane have been used to inhibit deposition on $SiO_2$, but these require elevated temperatures (100+° C.) and long reaction times (24-48 hours) to properly passivate the surface. [2] Furthermore, to act as a diffusion barrier, 2-diphenylphosphino-ethyl-triethoxysilane (DPPETS) has been used as a SAM which binds to Cu, inhibiting diffusion through the oxide layer at elevated temperatures [3].

Previous work has passivated hydroxyl groups on $SiO_2$ by using longer-chained molecules such as octadecyltrichlorosilane (ODTS) [2,6] or less-reactive molecules such as hexamethyldisilazane, which require high temperatures and long passivation times. Other passivants such as long-chained thiols have focused on passivating the surface of metals while leaving oxides or silicon ready for deposition [4,5]. DPPETS has been used as a diffusion barrier for Cu on $SiO_2$, showing that the presence of the diphenyl-phosphino group on treated $SiO_2$ inhibits Cu diffusion [3]. HMDS and TMDS were also used as gas-phase silylation agents for lithography application, which TMDS was shown to be a lower-temperature agent to carry out silylation. [7,8].

REFERENCE LIST

[1] Gall, Daniel. "Electron mean free path in elemental metals." Journal of Applied Physics 119.8 (2016): 085101.

[2] Guo, Lei and Zaera, Francisco. "Spatial resolution in thin film deposition on silicon surfaces by combining silylation and UV/ozonolysis." Nanotechnology 25(20) (2014): 504006.

[3] Mikami, Noboru; Hata, Nobuhiro; Kikkawa, Takamaro; Machida, Hideaki. "Robust self-assembled monolayer as diffusion barrier for copper metallization" Applied Physics Letters 83(25) (2003): 5181.

[4] Lecordier, Laurent; Herregods, Sebastiaan; Armini, Silvia. "Vapor-deposited octadecanethiol masking layer on copper to enable $Hf_3N_4$ atomic layer deposition on dielectrics studied by in situ spectroscopic ellipsometry." Journal of Vacuum Science & Technology A, 36 (2018) 031605.

[5] Hashemi, Fatemeh; Birchansky, Bradlee; Bent, Stacey F. "Selective Deposition of Dielectrics: Limits and Advantages of Alkanethiol Blocking Agents on Metal-Dielectric Patterns" ACS Applied Materials and Interfaces, 8 (2016) 33264-33272.

[6] Park, K. J.; Doub, J. M.; Gougousi, T.; Parsons, G. N. "Microcontact patterning of ruthenium gate electrodes by selective area atomic layer deposition" Applied Physics Letters 86 (2005) 051903.

[7] Baik, Ki-ho; Van den hove, L.; Goethals, A. M.; Op de Beeck, M.; Roland, B. "Gas phase silylation in the diffusion enhanced silylated resist process for application to sub-0.5 um optical lithography" Journal of Vacuum Science & Technology B, 8 (1990) 1481.

[8] Baik, Ki-ho; Van den hove, L.; Roland, B. "Comparative study between gas- and liquid-phase silylation for the diffusion-enhanced silylated resist process" Journal of Vacuum Science & Technology B, 9 (1991) 3399.

[9] Choi, Jong Y.; Ahles, Christopher F.; Hung, Raymond; Kim, Namsung; Kummel, A. C. "Selective atomic layer deposition of $MoSi_x$ on Si (001) in preference to silicon nitride and silicon oxide." Applied Surface Science 462 (2018) 1008-1016.

SUMMARY

According to an aspect of the inventive concept, provided is a method for passivating an oxide layer of a substrate comprising: a) pre-treating a surface of the oxide layer, the surface of the oxide layer comprising hydroxyl groups, wherein the pre-treating cleans and renders the surface of the oxide layer hydrophilic; and b) exposing the oxide layer to a passivant, wherein the passivant binds to —OH or O on silicon oxide ($SiO_x$), copper oxide ($CuO_x$), and/or cobalt oxide ($CoO_x$) below about 200° C., and wherein the surface of the oxide layer is rendered hydrophobic after exposure to the passivant.

According to another aspect of the inventive concept, provided is a method for depositing a metal, metal oxide, or metal silicide layer selectively on a substrate, the substrate comprising a surface comprising: an oxide layer portion comprising hydroxyl groups; and a metal, metal oxide, or silicide portion, the method comprising: a) pre-treating the oxide layer portion of the surface of the substrate, wherein the pre-treating cleans and renders the oxide layer portion of the surface of the substrate hydrophilic; b) exposing the substrate to a passivant that renders the oxide layer portion of the surface of the substrate hydrophobic; c) annealing the substrate at a temperature wherein the passivant binds selectively to the oxide layer portion of the surface of the substrate over the metal, metal oxide, or silicide portion of the surface of the substrate; and d) selectively growing the metal, metal nitride, metal oxide or metal silicide layer on the metal, metal oxide, or silicide portion of the surface of the substrate, wherein the metal, metal oxide, metal nitride or metal silicide layer is grown by atomic layer deposition (ALD). According to yet another aspect of the inventive concept, provided is a method for depositing an molybdenum silicide ($MoSi_x$) or titanium oxide ($TiO_2$) layer selectively on a substrate, the substrate comprising a surface comprising: an $SiO_2$ portion; and a Cu, Co, or Si portion, the method comprising: a) pre-treating the $SiO_2$ portion of the surface of the substrate, wherein the treating renders the $SiO_2$ portion of the surface of the substrate hydrophilic; b) exposing the $SiO_2$ portion of the surface of the substrate to a passivant that renders the $SiO_2$ portion of the surface of the substrate hydrophobic; c) annealing the substrate at a temperature wherein the passivant binds selectively to the $SiO_2$ portion of the surface of the substrate over the Cu, Co, or Si portion of the surface of the substrate; and d) selectively growing the $MoSi_x$ or $TiO_2$ layer on the Cu, Co, or Si portion of the surface of the substrate, wherein the $MoSi_x$ or $TiO_2$ layer is grown by atomic layer deposition (ALD).

BRIEF DESCRIPTION OF THE DRAWINGS

FIG. 7: Table of contact angles before/after UHV anneal with/without TMDS passivation. $SiO_2$ maintains hydrophobicity after UHV anneal, while TMDS are removed from Cu/Co, decreasing angle to clean level.

DETAILED DESCRIPTION

Figure 1:
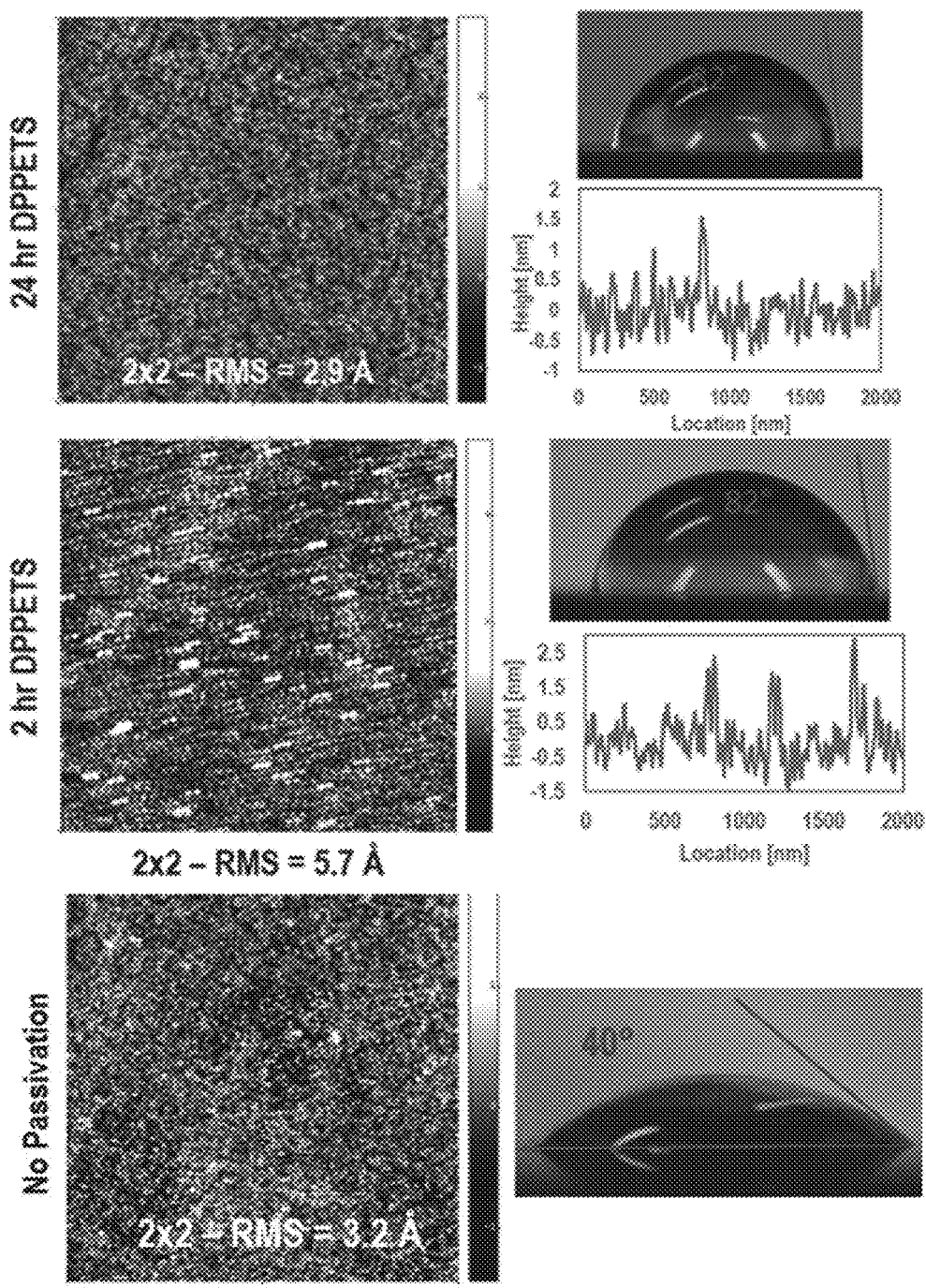
FIG. 1: Atomic force microscopy (AFM) and contact angles of $SiO_2$ after DPPETS passivation. Unpassivated $SiO_2$ has a contact angle of 40°, compared with hydrophobic DPPETS after 2 and 24 hours having 82°.

The foregoing and other aspects of the present inventive concept will now be described in more detail with respect to other embodiments described herein. It should be appreciated that the inventive concept can be embodied in different forms and should not be construed as limited to the embodiments set forth herein. Rather, these embodiments are provided so that this disclosure will be thorough and complete, and will fully convey the scope of the inventive concept to those skilled in the art.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

Unless otherwise defined, all technical and scientific terms used herein have the same meaning as commonly understood by one of ordinary skill in the art to which this inventive concept belongs.

The term atomic layer deposition, or ALD, as used herein, can broadly refer to the level of layer dimensional control in a deposition process, that can be achieved at the angstrom (Å) or sub-angstrom level. Thus, deposition of or growth of a layer through atomic layer deposition, or a cycle thereof, may generally correspond to the size of atoms.

The choice of precursor or precursors to deposit metal, metal oxide, or metal silicide films according to methods of the inventive concept are not particularly limited, and may be any that may be appreciated by one of skill in the art. ALD, according to embodiments of the present inventive concept, may include the use of one precursor, two precursors, or more than two precursors per deposition cycle. For example, in some embodiments, the precursor choice for the deposition of $MoSi_x$ films may include using $MoF_6$ and $Si_2H_6$ as precursors. In some embodiments, the precursor choice for the deposition of $HfO_2$ films may include using Hf(OtBu)$_4$ as a precursor. In some embodiments, the precursor choice for deposition of TiO$_2$ films may include using Ti(OiPr)$_4$ as a precursor.

The number of ALD or deposition cycles performed in the methods of the present inventive concept is not particularly limited, and may be as few as one cycle, and as many as about 2, 5, 10, 20, 30, 40, 50, 100, 150, 200, 300, 400, 500, 600, 700, 800, 900, to about 1,000 cycles, or more, or any number of cycles therebetween.

Additionally, according to embodiments of the present inventive concept, the average layer thickness or layer growth per ALD or deposition cycle can be less than 1 Å per ALD or deposition cycle, for example, less than about 0.1 Å, about 0.1 Å, about 0.2 Å, about 0.3 Å, about 0.4 Å, about 0.5 Å, about 0.6 Å, about 0.7 Å, about 0.8 Å, or about 0.9 Å per cycle, or more than 1 Å per cycle, for example, about 1 Å, about 1.2 Å, about 1.3 Å, about 1.4 Å, about 1.5 Å, about 1.6 Å, about 1.7 Å, about 1.8 Å, about 2 Å, about 3 Å, about 4 Å, about 5 Å, about 6 Å, about 7 Å, about 8 Å, about 9 Å, about 10 Å (1 nm), about 11 Å, about 12 Å, about 13 Å, about 14 Å, about 15 Å, about 16 Å, about 17 Å, about 18 Å, about 19 Å, or about 20 Å (2 nm) per cycle, or any dimension therebetween.

The inventive concept overcomes limitations and disadvantages of prior techniques. The inventive concept provides ALD techniques, which enable the selective deposition of metals, metal oxides and metal silicides on a surface or substrate. According to embodiments of the present inventive concept, selective deposition may refer to deposition of, for example, a material, such as a metal or a material including a metal, on a first portion of a surface or substrate, without deposition, with minimal deposition, or with significantly less or reduced deposition, of the material on a second portion of the substrate or surface. The first and second portions of the surface or substrate may be of differing materials or composition. Selective deposition on a surface may be achieved by selective passivation of one surface material over another surface material according to embodiments of the inventive concept. For example, TMDS or similar compounds bind to —OH or O on CuO$_x$, CoO$_x$, and SiO$_x$ below about 200° C. However, when heated to >300° C., the CuO$_x$ and CoO$_x$ desorb, leaving behind an unpassivated surface. The TMDS binding to SiO$_2$ is stable to about 350° C., resulting in selective passivation of an SiO$_2$ surface over, for example, a copper (Cu) or cobalt (Co) surface. The successful testing for TMDS provides evidence of a general mechanism for any small molecule passivant on the native oxide or deposited oxide on a metal with an oxide which is volatile below 300° C. As a result, selective deposition occurs on the unpassivated surface over the passivated surface.

Accordingly, in embodiments of the present inventive concept, provided are methods of selective deposition of metals, for example, selectively depositing molybdenum (Mo), hafnium (Hf), or titanium (Ti), or oxides or silicides thereof, on a first surface or portion of a substrate, such as, for example, a silicide surface, such as an Si (001) surface, or a metal surface, such as, for example, a Cu or Co surface, over a second surface of the substrate, such as an insulator surface, such as, but not limited to, an SiO$_2$ surface on a substrate. According to methods of the inventive concept, in some embodiments, a molybdenum silicide (MoSi$_x$) film is deposited. in some embodiments, a hafnium oxide (HfO$_2$) film is deposited. in some embodiments, a titanium oxide film (TiO$_2$) is deposited.

The passivant, according to embodiments of the present inventive concept, may selectively passivate an insulating layer or surface, such as an SiO$_2$ surface or layer. The passivant may be a small molecule, such as an ethoxysilane, or a disilazane, for example, an ethoxysilane such as 2-di-phenylphosphino-ethyl-triethoxysilane (DPPETS), or a disilazane such as tetramethyldisilazane (TMDS). In some embodiments, the passivant renders a layer or surface that is hydrophilic, such as SiO$_2$, hydrophobic after the passivation process. In some embodiments, passivation of a surface may prevent unwanted nucleation, which interferes with the selective deposition process, of the material being deposited.

Prior to passivation of the surface, the surface may be cleaned. For example, if the surface to be passivated includes hydroxyl groups, such as an SiO$_2$ surface, the surface may be degreased by any method that would be appreciated by one of skill in the art, followed by, for example, dipping or soaking in a solution, such as dipping or soaking in an HF solution. The cleaning process of the surface to be passivated may render the surface hydrophilic.

The method of passivating a surface, such as a surface that has been degreased and rendered hydrophilic as described above, is not particularly limited, and may be any method that would be appreciated by one of skill in the art. In some embodiments, passivation of a surface may include exposure of the surface to a solution including the passivant. The surface may be exposed to a solution including the passivant for a period of time that is about 24 hours or less, for example, about 2 hours, about 24 hours, or between about 2 hours and about 24 hours, at a temperature of less than about 100° C., for example, about 70° C., or any temperature between about 70° and about 100° C. In some embodiments, hydrophilic hydroxyl groups on the surface to be passivated, may be replaced by hydrophobic phenyl or methyl groups as a result of the passivation process.

Following exposure to the passivant, the surface that is to be selectively passivated, and other surfaces including differing materials that may have been exposed to the passivant, may be subjected to an annealing step, such as an ultra-high vacuum (UHV) anneal, prior to deposition. The temperature at which the UHV anneal takes place is not particularly limited. However, in some embodiments, the temperature at which the UHV anneal takes place, the surface to be selectively passivated, such as an SiO$_2$ surface, remains passivated, whereas other surfaces, for example, surfaces on which selective deposition may take place, such as a Cu or Co metal surface, may return to an unpassivated condition/state, and/or maintain characteristics of an unpassivated surface. For example, for TMDS as a passivant, the temperature at which the UHV anneal takes place may be about 300° C. or above about 300° C. using SiO$_2$ as the passivated surface and Cu or Co as the surface on which selective deposition takes place. In some embodiments, the UHV anneal may take place at a temperature of about 250° C., about 260° C., about 270° C., about 280° C., about 290° C., about 300° C., about 310° C., about 320° C., about 330° C., about 340° C., or about 350° C., or any temperature therebetween. In some embodiments, the temperature at which the UHV anneal takes place, any passivant that may be bound to surfaces on which selective deposition may take place desorbs, and as such, results in an unpassivated surface, or a surface having characteristics of an unpassivated surface, and on which selective deposition may then proceed. Similarly, the duration time of the UHV anneal and the pressure at which the UHV anneal takes place are not particularly limited. For example, in some embodiments, the duration of the UHV anneal may be for about 30 minutes, and the pressure at which the UHV anneal takes place is less than about 10$^{-9}$ torr, for example, about 9×10$^{-10}$ torr, about $8\times10^{-10}$ torr, about $7\times10^{-10}$ torr, about $6\times10^{-10}$ torr, about $5\times10^{-10}$ torr, about $4\times10^{-10}$ torr, about $3\times10^{-10}$ torr, about $2\times10^{-10}$ torr, or about $10^{-10}$ torr, or even less than about $10^{-10}$ torr.

Following the annealing step, the selective deposition of a material on the unpassivated surface may take place using, for example, the ALD methods as described herein.

Having described various aspects of the present inventive concept, the same will be explained in further detail in the following examples, which are included herein for illustration purposes only, and which are not intended to be limiting to the inventive concept.

EXAMPLES

Experiments tested two compounds that enable selective ALD-2-diphenylphosphino-ethyl-triethoxysilane (DPPETS) and tetramethyldisilazane (TMDS). Both compounds bind to the hydroxyl groups on $SiO_2$ and replace them with nonreactive phenyl or methyl groups, while not binding to the surface of Cu or Si. Atomic layer deposition of molybdenum silicide ($MoSi_x$) and titanium dioxide ($TiO_2$) demonstrates that the deposition of both can be inhibited on $SiO_2$ while proceeding as normal on Si. Liquid-phase treatment of $SiO_2$ at 70° C. passivates hydroxyls, which remain passivated after UHV anneal, and enhances selectivity of both metal silicide and metal oxide processes.

By passivating hydroxyls in the liquid phase, $SiO_2$ can be rendered inert similar to the surface of low-k methyl-terminated SiCOH. This will enable the selective passivation of a patterned surface which can allow for bottom-up metal/metal oxide fill.

Selective ALD with DPPETS.

Figure 2:
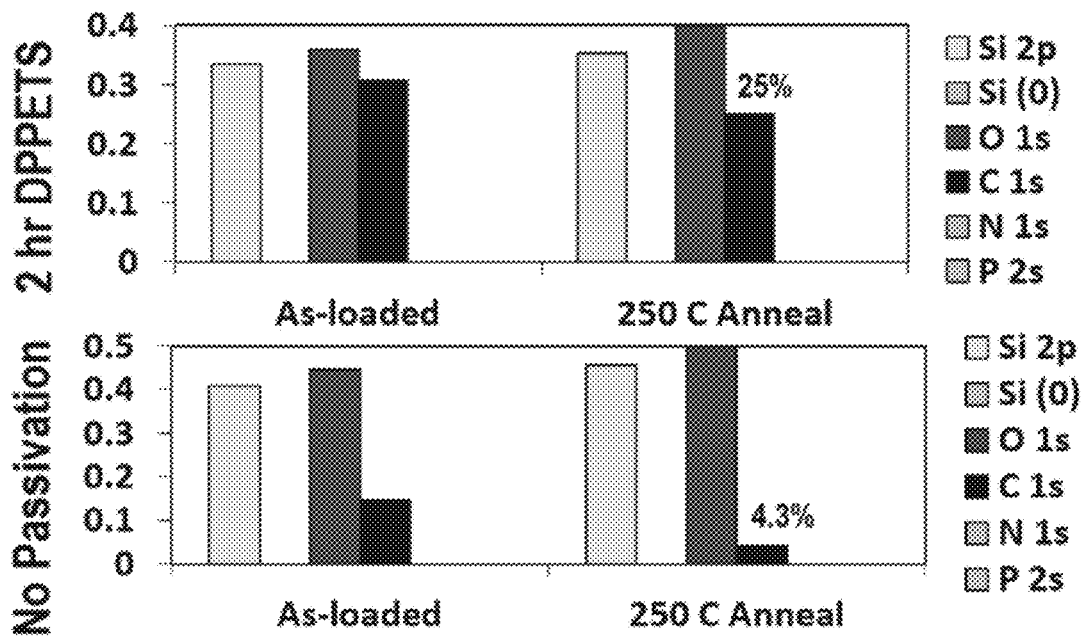
FIG. 2: X-ray photoelectron spectroscopy (XPS) study of unpassivated/DPPETS-passivated $SiO_2$. DPPETS-passivated $SiO_2$ after 2 hours shows 25% C bonded to surface after annealing under ultra-high vacuum (UHV) at 260° C., compared with 4% for unpassivated $SiO_2$.

$SiO_2$ typically has hydrophilic hydroxyl groups on its surface, which when wetted by water results in a low contact angle (<40°). To determine the effectiveness of passivation, thermally-grown $SiO_2$ was first degreased with xylene, acetone, methanol, and DI water under sonication, followed by a 30 second 0.5% HF dip to result in a hydrophilic surface condition. Then, passivation was carried out under anhydrous $N_2$ atmosphere in a liquid-phase solution of 1% DPPETS dissolved in toluene at 70° C. for 2 or 24 hours. Hexane sonication was used to remove excess particles after passivation. By AFM, RMS roughness was observed as 0.29 nm over a 2×2 µm region after 24 h passivation, and 0.57 nm after 2 h passivation. Contact angle measurements showed an 82° contact angle on both 2 h and 24 h passivated $SiO_2$, compared with an HF-only contact angle of 40° (FIG. 1). XPS studies of the $SiO_2$ surface after passivation shows an increase in carbon content after 250° C. UHV anneal due to the presence of bonded SAM (FIG. 2).

Figure 3:
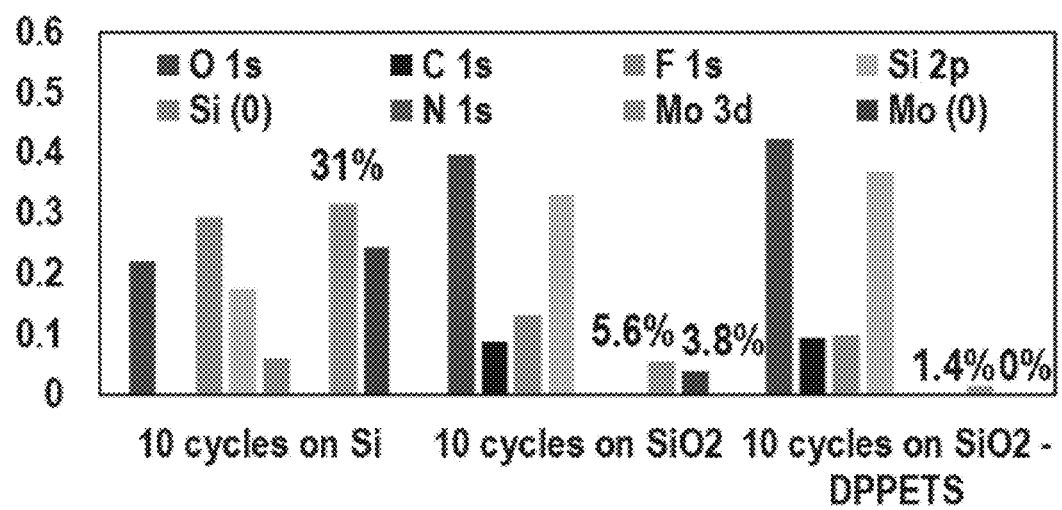
FIG. 3: XPS study of 10 cycles $MoSi_x$ deposition on $Si/SiO_2/DPPETS$-$SiO_2$. On unpassivated $SiO_2$, 5.6% Mo content compared with 1.4% on DPPETS-passivated $SiO_2$, with 3.8% unoxidized Mo compared with zero unoxidized Mo on passivated surface.
Figure 4:
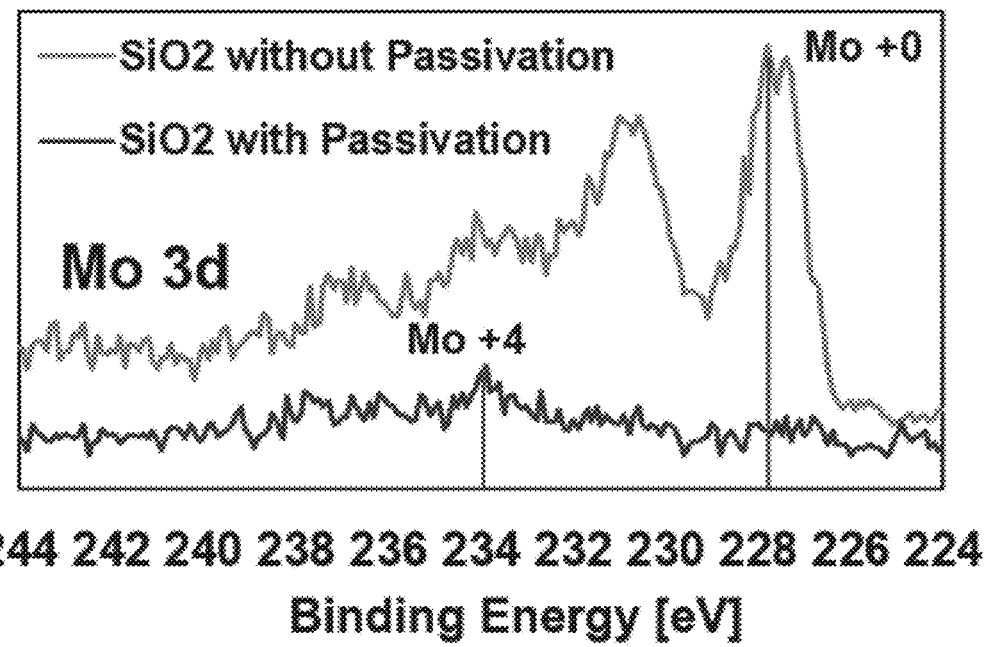
FIG. 4: Suppression of metallic Mo component by DPPETS passivation.
Figure 5:
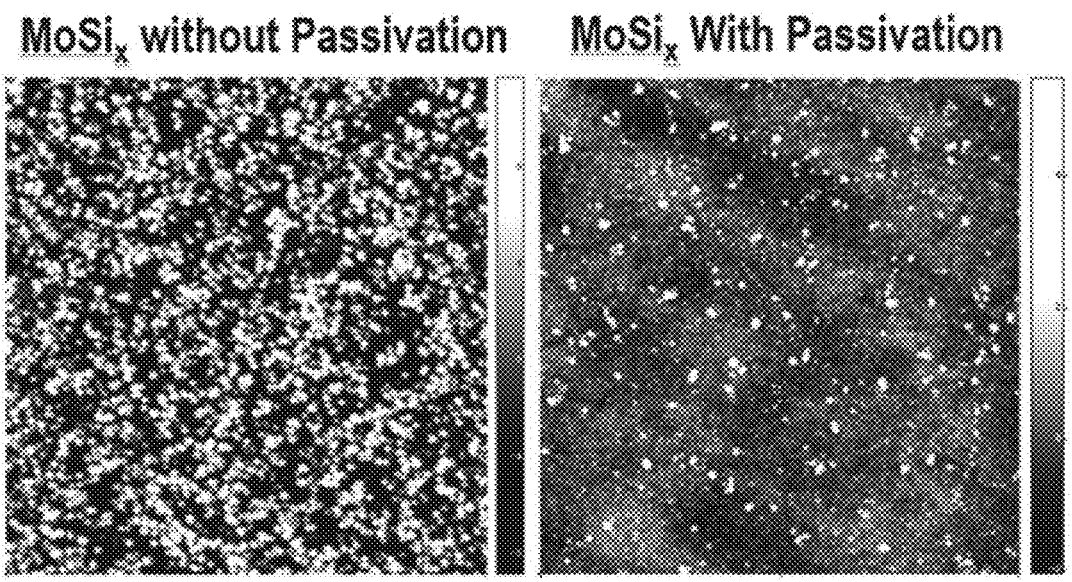
FIG. 5: Reduction in Nucleation Density by DPPETS Passivation. Unpassivated $SiO_2$: 244 nuclei/$\mu m^2$. Passivated $SiO_2$: 55 nuclei/$\mu m^2$. Particles on passivated surface are shorter and likely passivation residue from incomplete post-passivation clean.
Figure 6:
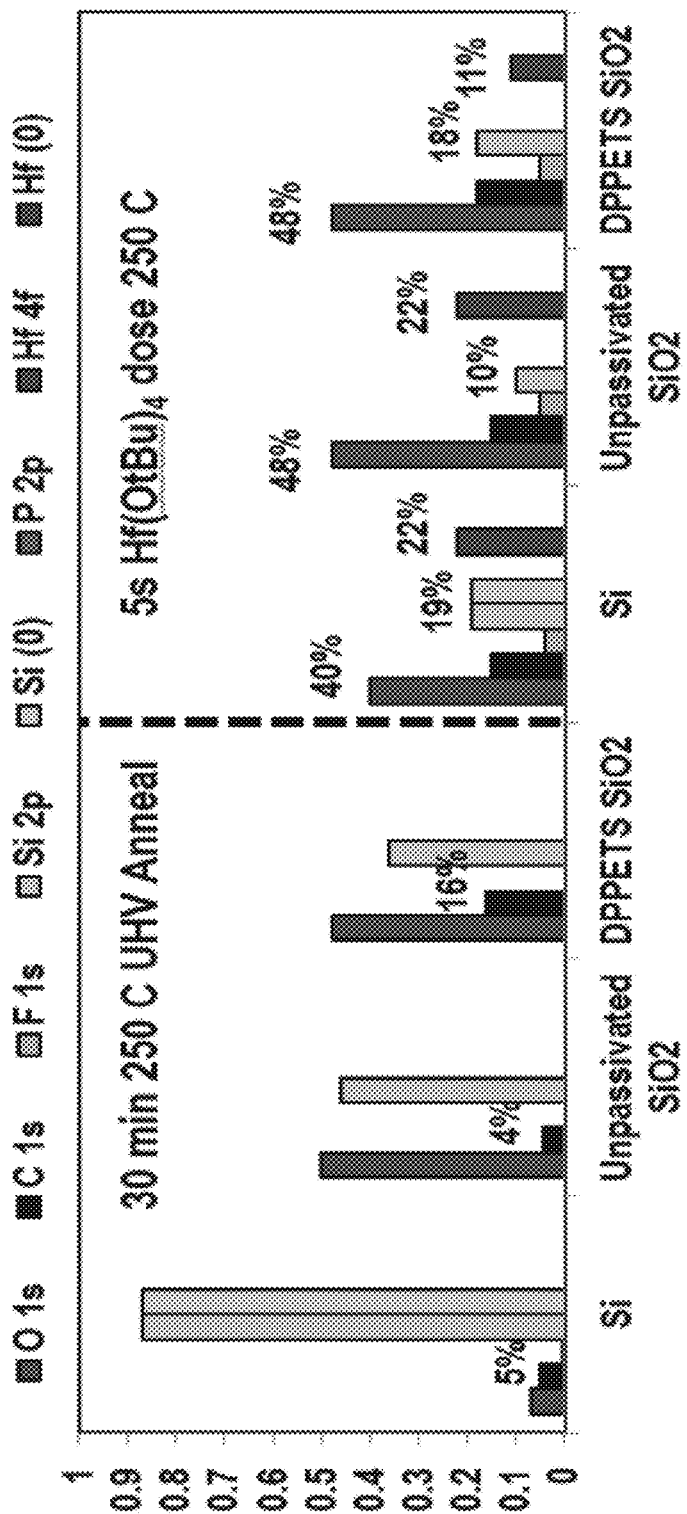
FIG. 6: Suppression of $HfO_2$ selective CVD on $SiO_2$ by DPPETS passivation. 2× reduction in Hf content on DPPETS-passivated $SiO_2$ compared with unpassivated $SiO_2$ or Si.

Next, molybdenum silicide ($MoSi_x$) was deposited using $MoF_6+Si_2H_6$ precursors at 120° C. as a process known to be selective on Si, but may react with surface hydroxyl groups [9]. XPS was used to examine the chemical composition of the resulting surface, with 10 cycles of deposition yielding a 4× reduction in Mo content on DPPETS-passivated $SiO_2$ compared with unpassivated $SiO_2$ (FIG. 3). Furthermore, the passivated $SiO_2$ surface inhibits the growth of metallic Mo, suggesting formation only of $MoO_x$ compared with $MoSi_x$ nuclei (FIG. 4). AFM studies of the surface confirm the presence of nuclei ~10 nm tall on the unpassivated $SiO_2$ that are effectively suppressed by the DPPETS passivation process (FIG. 5). The DPPETS passivation process was also shown to enhance selective CVD of $HfO_2$ using self-limiting exposures of $Hf(OtBu)_4$ at 250° C., with a 2× reduction in Hf content after a 5 s dose with preference to unpassivated $SiO_2$ and Si (FIG. 6).

Selective ALD with TMDS.

Figure 8:
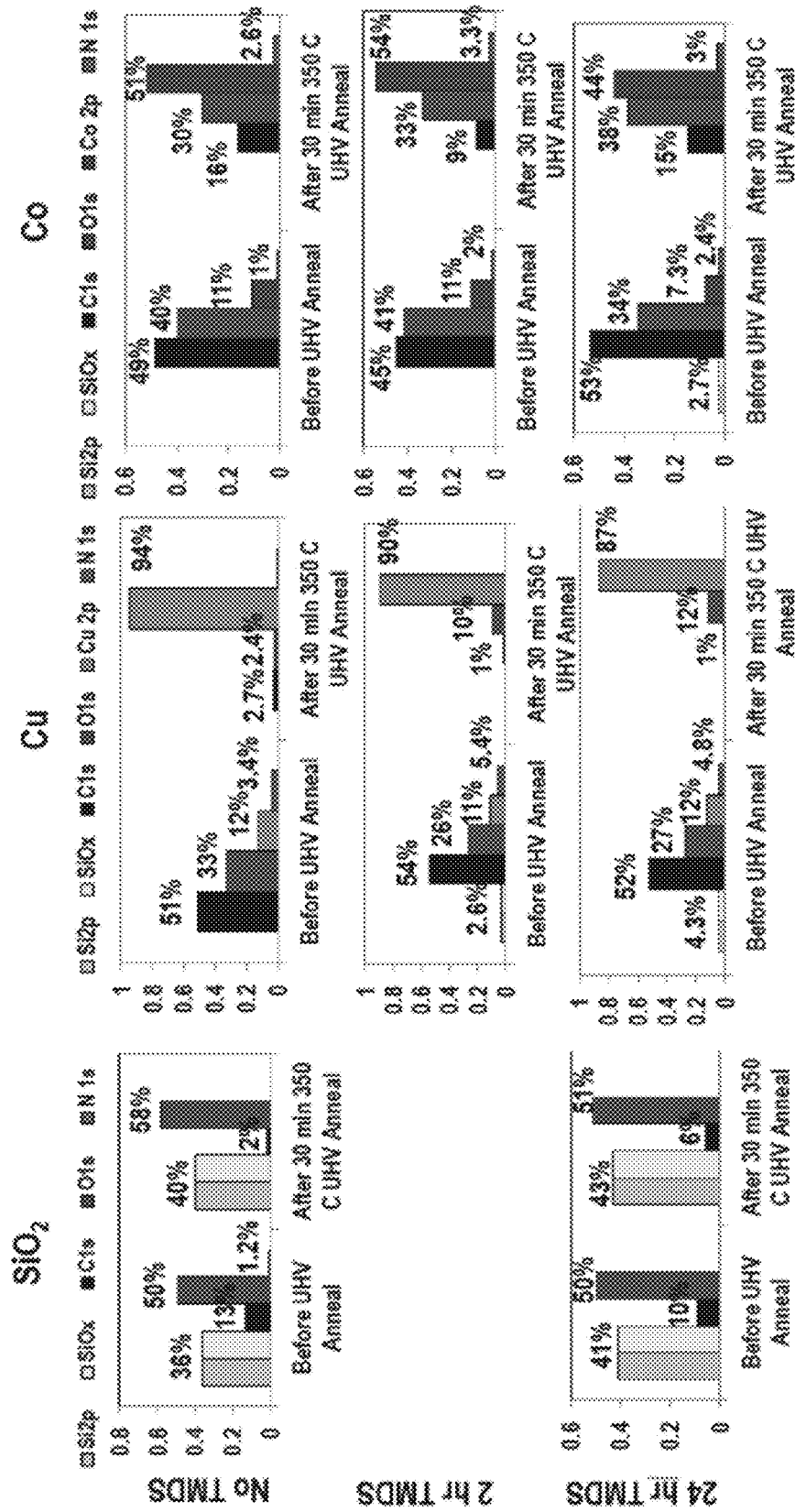
FIG. 8: XPS Study of $SiO_2$/Cu/Co with and without TMDS Passivation. After 350° C. UHV anneal, TMDS-passivated $SiO_2$ maintains 3× higher C content than unpassivated $SiO_2$, while Cu and Co lose residual Si and C content from TMDS after anneal.

Tetramethyldisilazane (TMDS) was also used to passivate surface hydroxyl groups in the same manner as the above-described DPPETS process. The passivation solution used was 1% in toluene. Contact angle and XPS studies were carried out on $SiO_2$, Cu, and Co before and after a UHV anneal at 350° C. On $SiO_2$, hydrophobicity of the surface was sustained after UHV anneal at 350° C. for 30 minutes, while on Cu and Co the contact angle returned to that of the unpassivated metal (Table in FIG. 7). In XPS, the C content on TMDS-passivated $SiO_2$ was 3× that of unpassivated $SiO_2$, while the C content on Cu and Co dropped to the same level as the unpassivated metals after UHV anneal, suggesting that metals will remain unpassivated by TMDS (FIG. 8).

Figure 9:
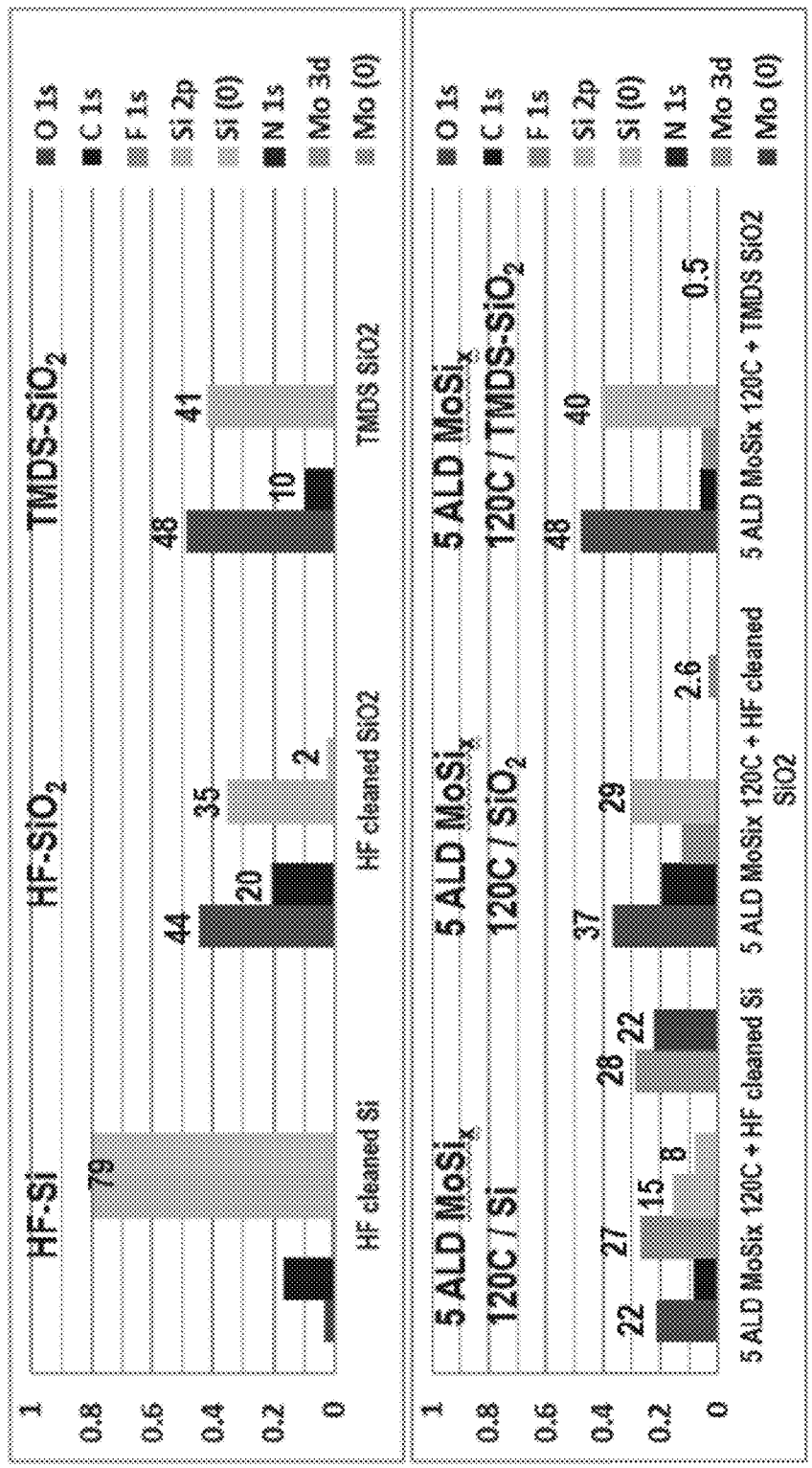
FIG. 9: XPS Study of $Si/SiO_2/TMDS$-$SiO_2$+$MoSi_x$ ALD. 5 cycles of $MoF_6$+$Si_2H_6$ at 120° C. shows 2.6% Mo on the unpassivated $SiO_2$, compared with 0.5% Mo on TMDS-passivated $SiO_2$.
Figure 10:
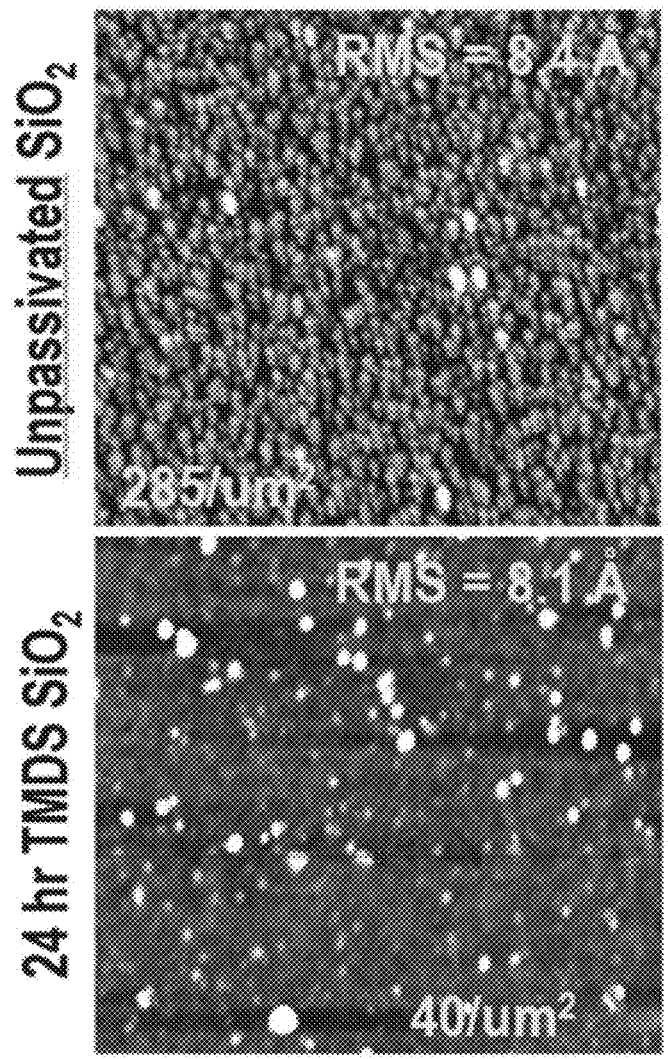
FIG. 10: AFM of Unpassivated vs Passivated $SiO_2$+ $MoSi_x$ ALD. Nucleation density on unpassivated $SiO_2$ is 285/$\mu m^2$ compared w/ 40 $\mu m^2$ for TMDS passivated $SiO_2$. Particles on TMDS are likely residual from liquid-phase treatment.
Figure 11:
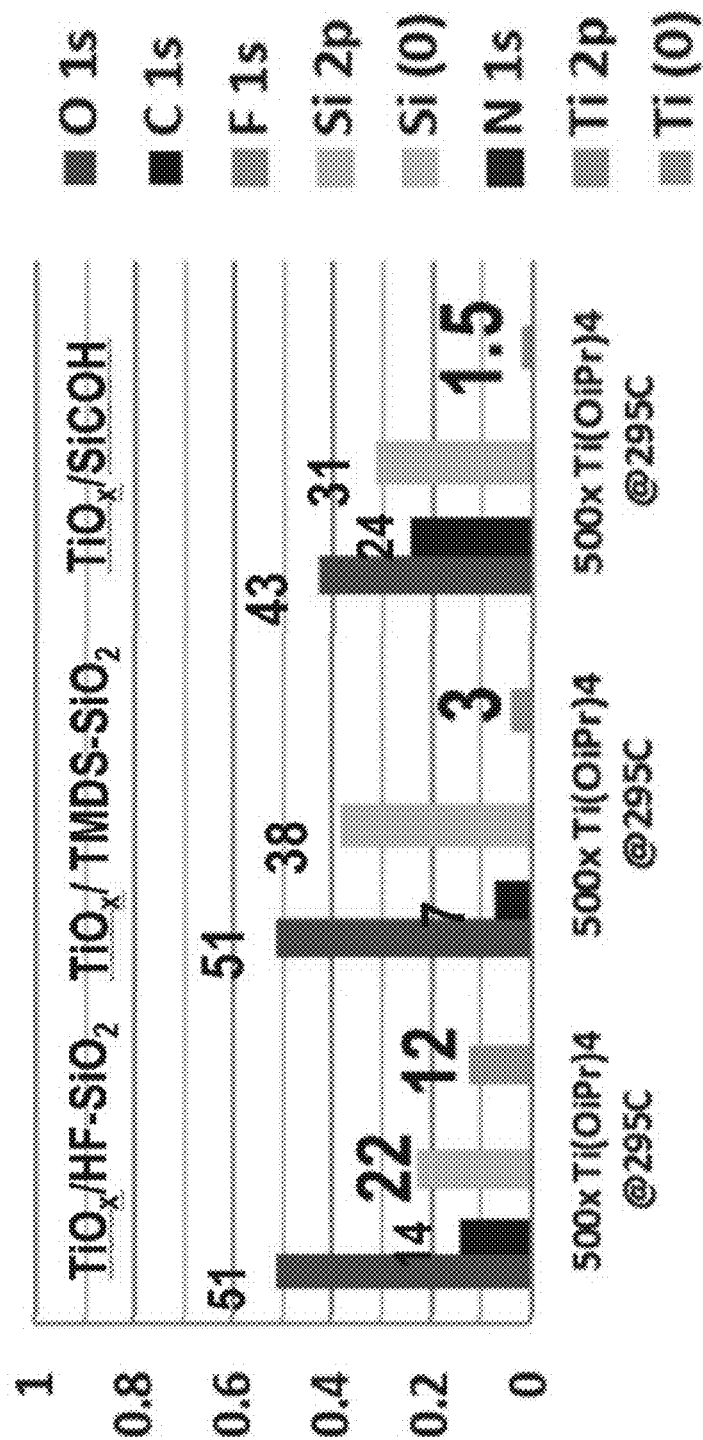
FIG. 11: XPS Study of $SiO_2$/TMDS-$SiO_2$/SiCOH+Selective CVD $TiO_2$ by $Ti(OiPr)_4$ SiCOH low-k dielectric shows 1.5% Ti after 500 pulses of Ti precursor, compared with 12% for unpassivated $SiO_2$. The TMDS-passivated $SiO_2$ surface shows 3%, suggesting termination of passivated surface acts similarly to the methyl-termination of the SiCOH surface.

$MoSi_x$ ALD was again performed on Si, unpassivated $SiO_2$, and TMDS-passivated $SiO_2$ at 120° C. After 5 cycles, the XPS studies showed a reduction in Mo content by 5× on the 24 hour TMDS-passivated $SiO_2$ compared with unpassivated $SiO_2$ (FIG. 9). AFM of the $SiO_2$ surfaces confirming the reduction of nuclei by a factor of 7× (FIG. 10). Selective self-limited CVD of $TiO_2$ was also performed at 295° C. on unpassivated and passivated $SiO_2$ and compared with low-k dielectric SiCOH. The TMDS-passivated $SiO_2$ had a 4× decrease in Ti content compared with unpassivated $SiO_2$, and within a factor of 2 of the low-k dielectric, suggesting the passivation can render the surface nearly as inert as the methyl-terminated surface of SiCOH (FIG. 11).

Figure 12:
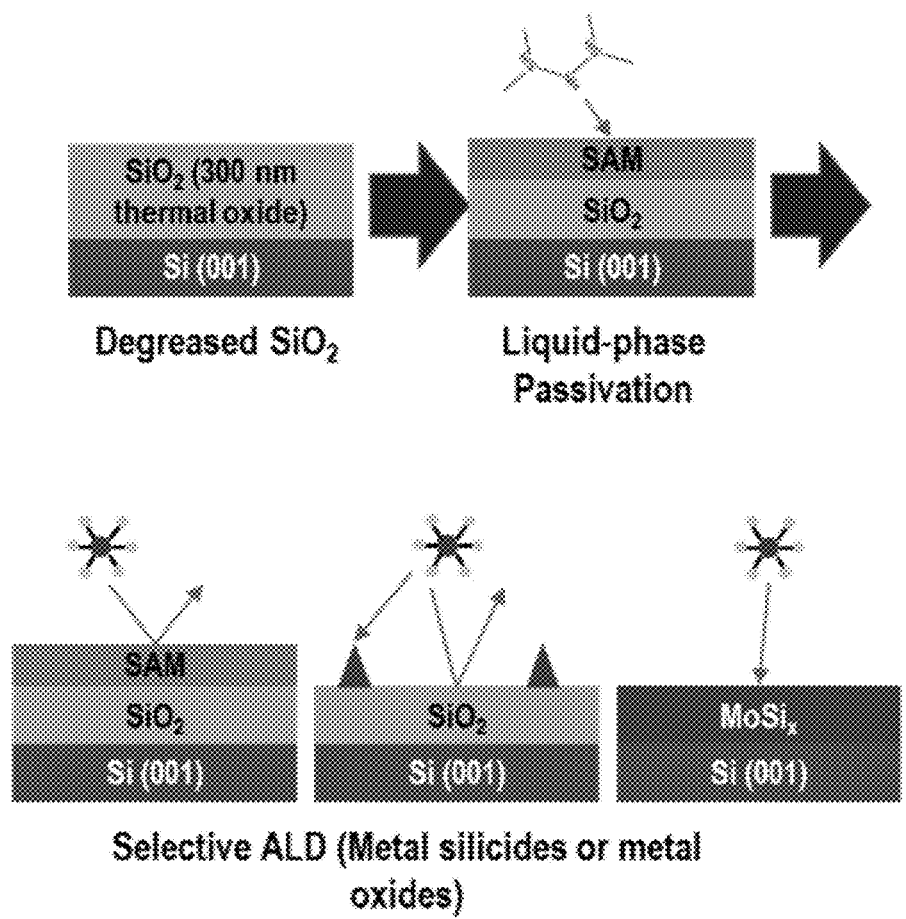
FIG. 12: General depiction of the use of SAMs as passivants for selective deposition in ALD.

Self-Assembled Monolayers (SAMs) for Hyperselective Silicide, Metal Oxide and Interconnect Diffusion Barriers The following exemplifies use of SAMs as passivants for selective ALD of metal oxides and silicides, and as organic interconnect barriers, as generally depicted in FIG. 12. Passivation of surface hydroxyl groups on $SiO_2$ is achieved by binding with ethoxysilanes or disilazanes, and characterized by water contact angle and atomic force microscopy (AFM). Effectiveness of passivation in enabling selective deposition of metal silicides and metal oxides using ALD processes was investigated using XPS and AFM to measure nucleation density.

The inventive concept enables passivated insulators to act as diffusion barriers, enables bottom-up filling of metals for large grain growth in confined vias, and enables selective deposition of metal oxides for patterning. See, for example, Mikami et al. *Appl. Phys. Lett.* 83(25):5181-5183 (2003).

ALD processes lose selectivity due to the presence of defects on $SiO_2$. Existing diffusion barriers deposited via PVD are in conformal in high-aspect ratio vias. Furthermore, passivants used are typically long-chained alkyls, or require high temperatures and/or long liquid-phase processing. See, for example, Chen et al. *Appl. Phys. Lett.* 86:191910 (2005). Passivating the surface of $SiO_2$ enhances the selective-area ALD of metal oxides and metal silicides, reducing unwanted nucleation.

Figure 13A:
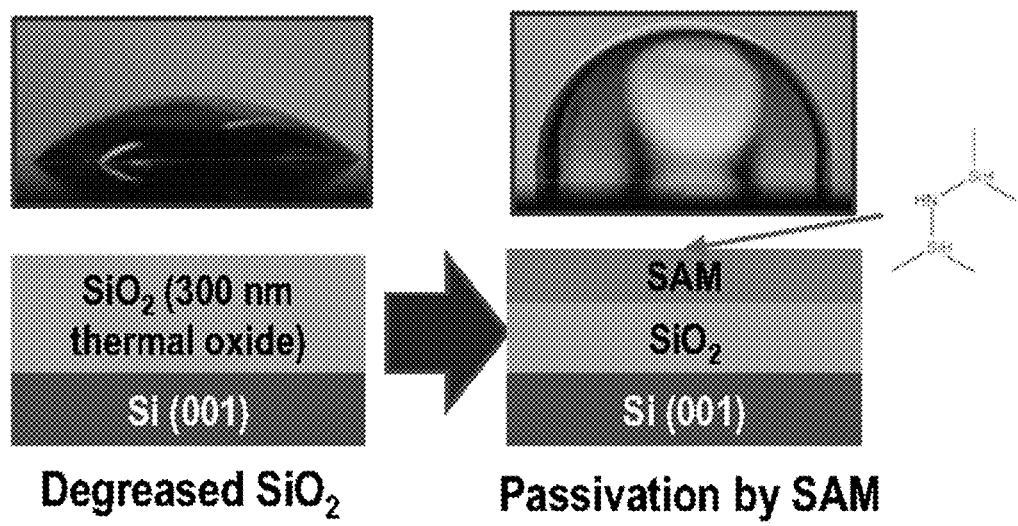
FIGS. 13A-13D: Passivation of surface hydroxyls on an oxide layer using DPPETS or TMDS. The SAM formed in the passivation process prevents nucleation and unfavorable layer formation on the oxide layer.
Figure 13B:
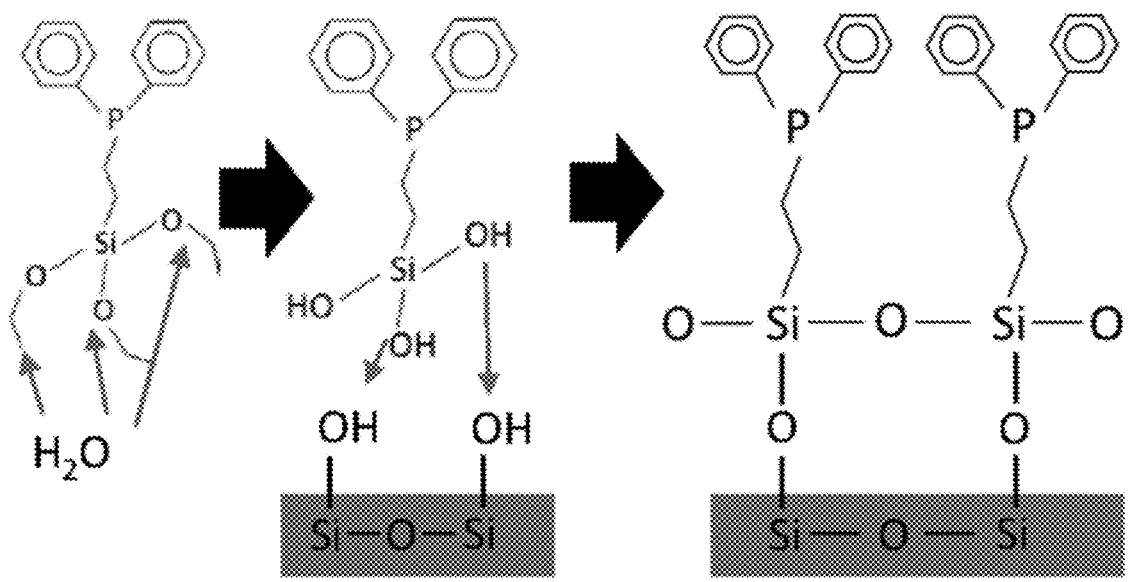
Figure 13C:
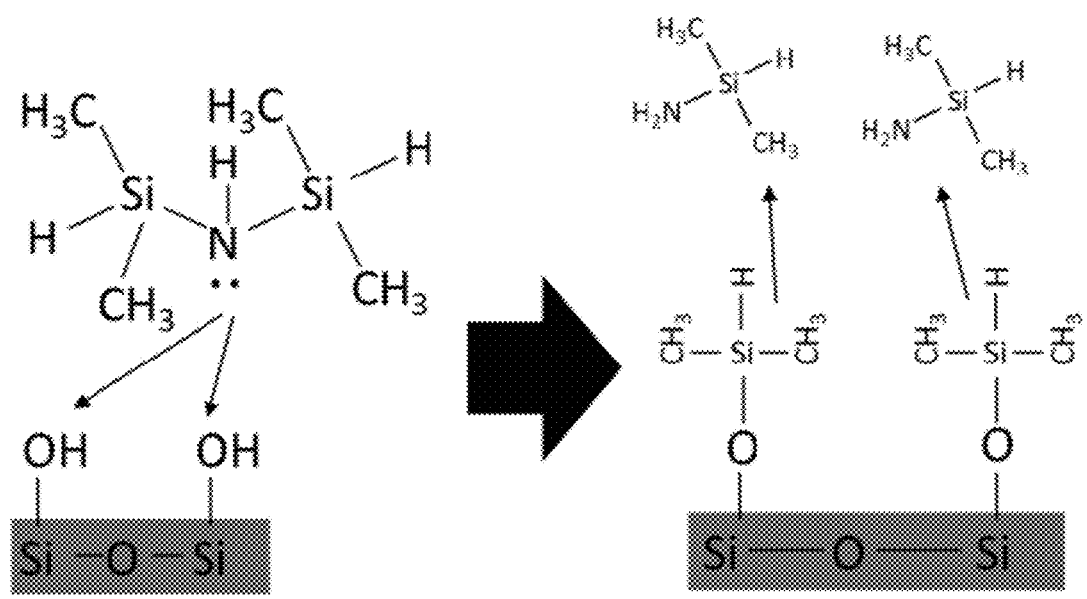
Figure 13D:
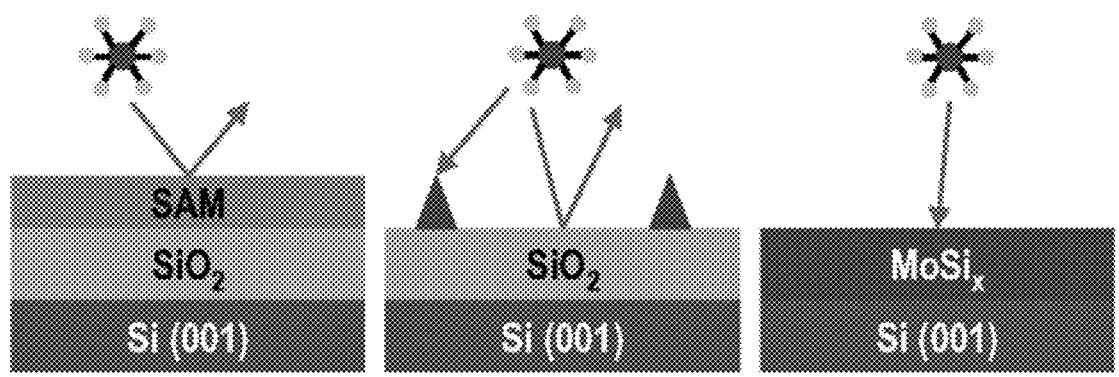

The passivation process of the present inventive concept involves ethoxysilanes and disilazanes reacting with surface hydroxyls of $SiO_2$, making the surface hydrophobic, as depicted in FIG. 13A. Ethoxysilanes, such as DPPETS, react with surface OH groups to form a continuous network of $SiO_2$ as depicted in FIG. 13B. Disilazinanes, such as TMDS, react with surface hydroxyls, leaving a methyl-terminated surface, as depicted in FIG. 13C. Hydroxyls on the surface of an insulator can nucleate and lead to forming of an otherwise unfavorable film in a selective ALD process, as depicted in FIG. 13D. Passivation stops this deposition.

Figure 14:
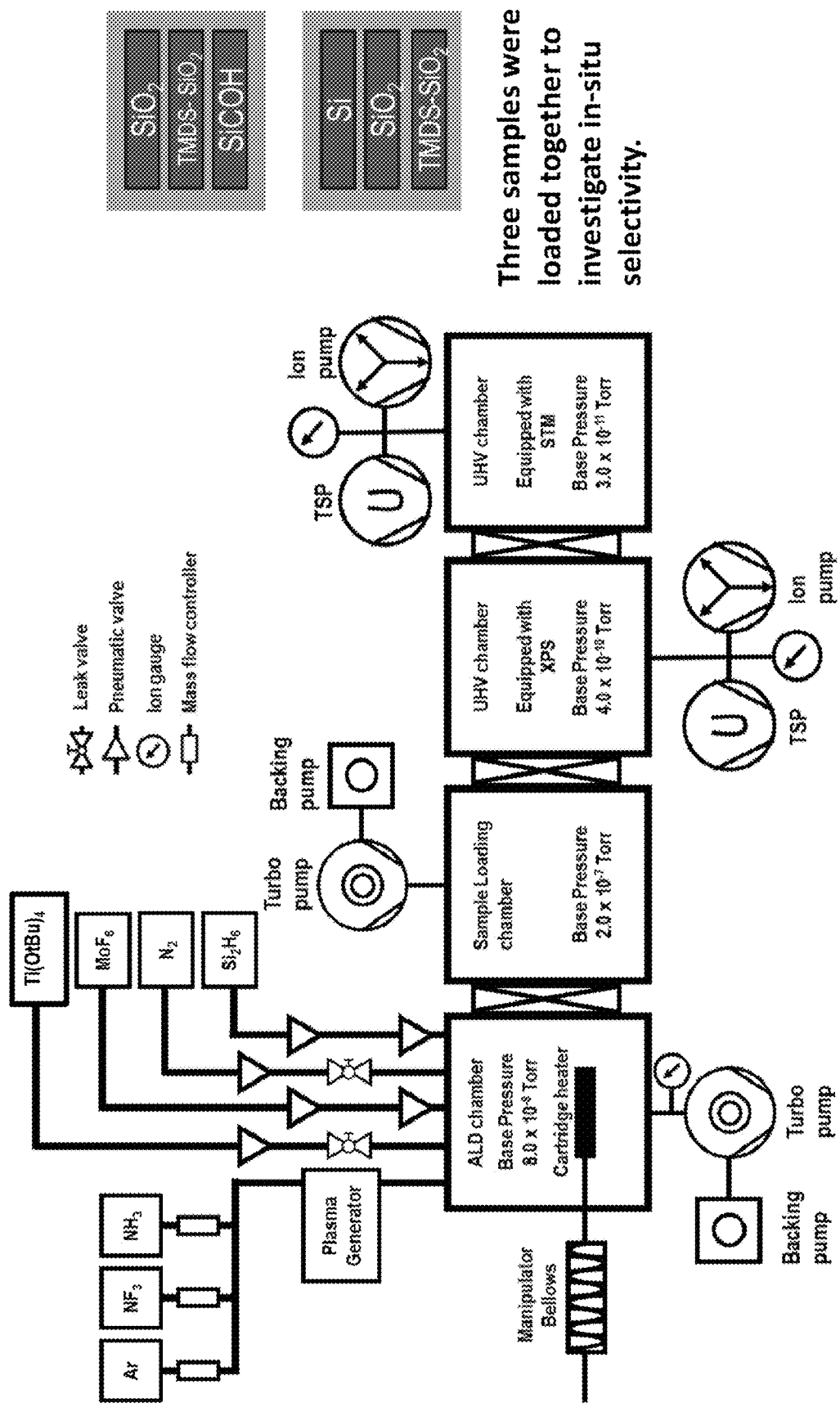
FIG. 14: Typical ALD+XPS chamber used in performing and analyzing selective ALD according to the present inventive concept.

A typical ALD+XPS Chamber includes a load-locked chamber and turbo pump to ensure a clean chamber between deposition runs. deposition takes place at 120° C. for $MoSi_x$, and at 300° C. for $TiO_2$. In-situ XPS measuring allows for deposition without air-break for metals and silicides. A typical ALD+XPS chamber is depicted in FIG. 14. Typically, three samples may be loaded together to investigate in situ selectivity of ALD.

$MoSi_x$ ALD is inherently selective towards Si over $SiO_2$. However, $MoSi_x$ will nucleate on hydroxyl groups on $SiO_2$, and after five cycles of $MoSi_x$ ALD on Si vs. unpassivated $SiO_2$, selectivity is lost. However, after passivation of $SiO_2$ with DPPETS, Mo content is reduced by 4× compared to unpassivated $SiO_2$. See, FIG. 3. Furthermore, XPS shows that unpassivated $SiO_2$ nucleates $MoSi_x$, whereas a passivated $SiO_2$ surface inhibits the growth of metallic Mo, and only $MoO_x$ nucleates on the passivated $SiO_2$ surface. See, FIG. 4. AFM of passivated $SiO_2$ following ALD exhibits a lower nucleation density vs. unpassivated $SiO_2$. See, FIG. 5.

Figure 15:
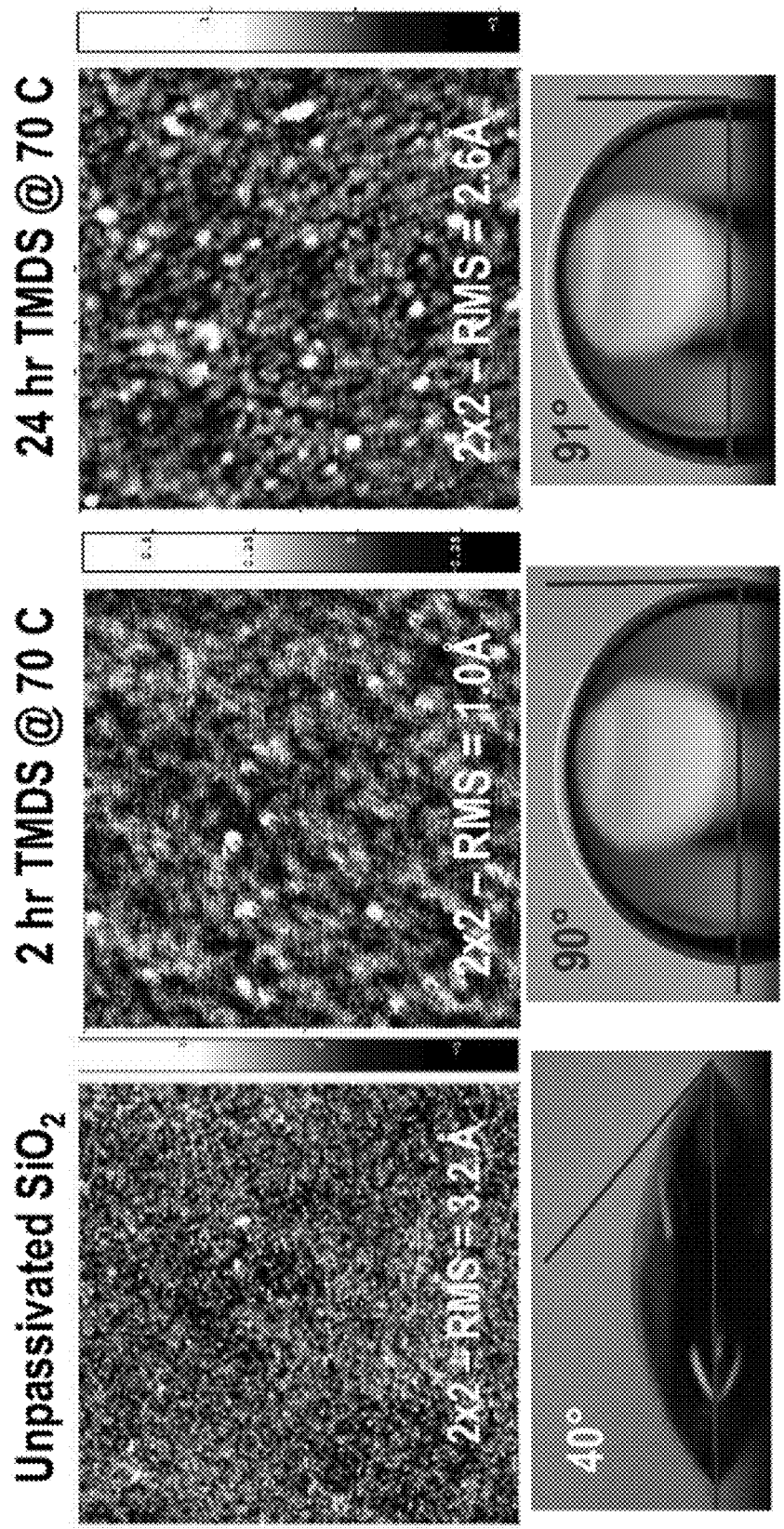
FIG. 15: AFM and droplet contact angle analysis of $SiO_2$ passivation with TMDS for 2 hours and 24 hours at 70° C., compared with unpassivated $SiO_2$.

TMDS was also used to passivate surface hydroxyl groups of $SiO_2$ in a similar manner to that described for passivation with DPPETS. Passivation using TMDS was carried out using a 1% solution in toluene under an $N_2$ atmosphere. Following passivation of $SiO_2$ with TMDS, a smooth, low roughness layer was observed by AFM, and high contact angle when wetted by water after both a 2 hour and a 24 hour passivation. See, FIG. 15. The surface of $SiO_2$ passivated with TMDS is more hydrophobic than $SiO_2$ passivated with DPPETS, as indicated by water droplet contact angle (90-91° for TMDS vs. 82° for DPPETS), indicating more effective passivation. As with DPPETS, An UHV anneal reduces C, as indicated by XPS, but TMDS-passivated $SiO_2$ retains hydrophobicity following the anneal.

Following an UHV anneal at 350° C. for 30 minutes, while there is a slight reduction in contact angle on the passivated sample (90° before vs. 83° after), but the passivated surface remains hydrophobic. $SiO_2$ after TMDS passivation retains $CH_3$ groups even after the UHV anneal, whereas TMDS leaves metal surfaces, such as Cu and Co. See, FIG. 8. As such, following an UHV anneal, $SiO_2$ surfaces are selectively passivated over metal surfaces.

Figure 16:
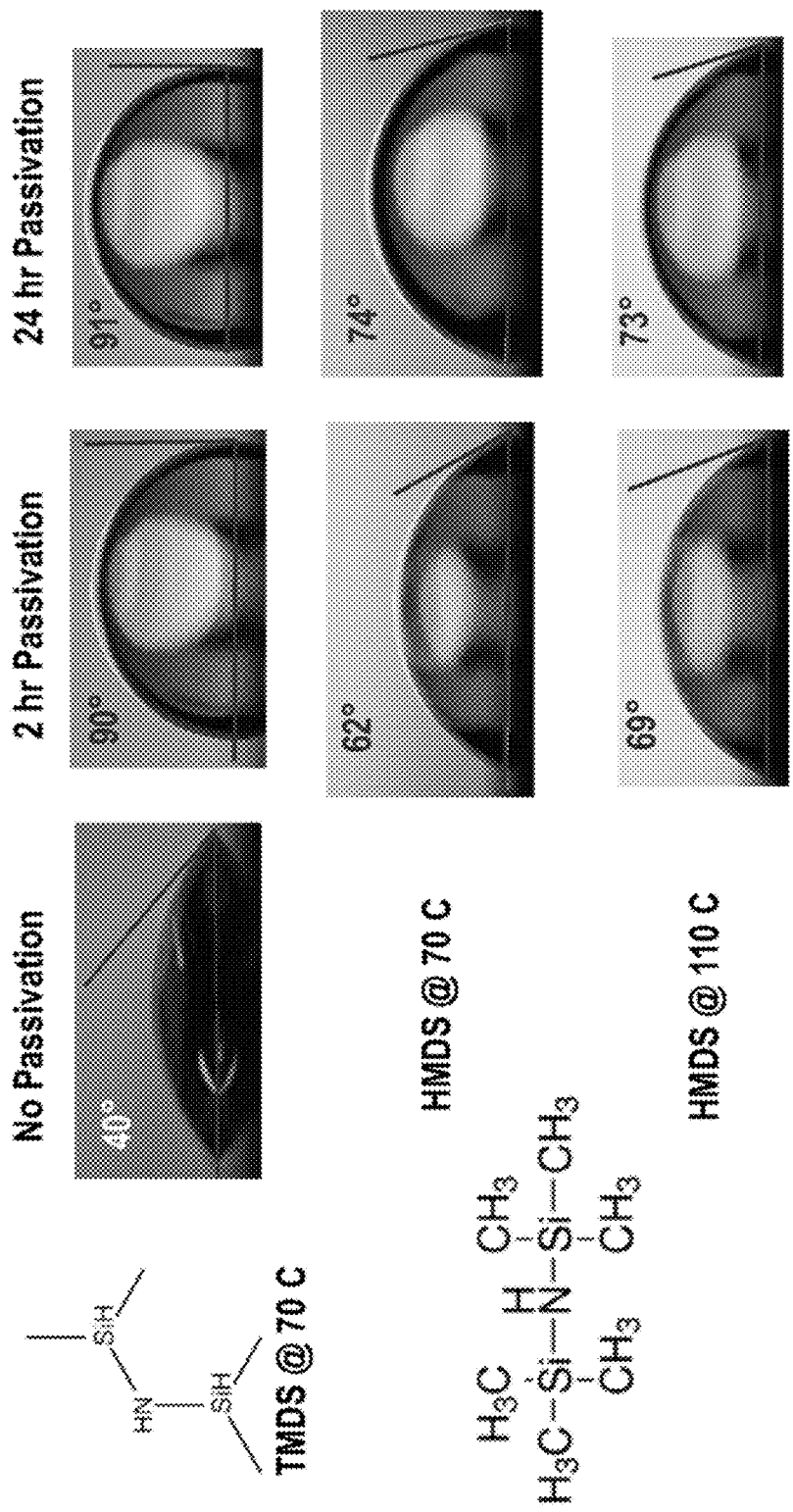
FIG. 16: Comparison of TMDS passivation with HMDS passivation of $SiO_2$ using AFM and contact angle analysis.

Hexamethyldisilazane (HMDS) has previously been used to passivate $SiO_2$ surface hydroxyls for ALD passivation. See, Guo and Zaera. *Nanotechnology.* 25:504006 (2014). However, at 70° C., TMDS passivation of $SiO_2$ produces a more hydrophobic surface than HMDS at 70° C. and at 110° C., consistent with TMDS be superior at passivation of —OH groups than HMDS. See, FIG. 16. The structure of TMDS allows for quicker reaction kinetics at lower temperatures than HMDS.

The effectiveness of TMDS was confirmed by performing 5 cycles of $MoSi_x$ ALD on TMDS-passivated $SiO_2$ and compared with ALD performed on unpassivated $SiO_2$. After 5 cycles of $MoSi_x$ ALD on unpassivated $SiO_2$, selectivity is lost and $MoSi_x$ starts nucleating on the unpassivated surface. However, as with DPPETS, TMDS passivation reduces Mo content by 7× on the TMDS-passivated $SiO_2$ surface compared with unpassivated $SiO_2$. See, FIG. 9. AFM further shows the TMDS-passivated $SiO_2$ surface exhibits a lower nucleation density than the unpassivated $SiO_2$ surface. See, FIG. 10.

Figure 17:
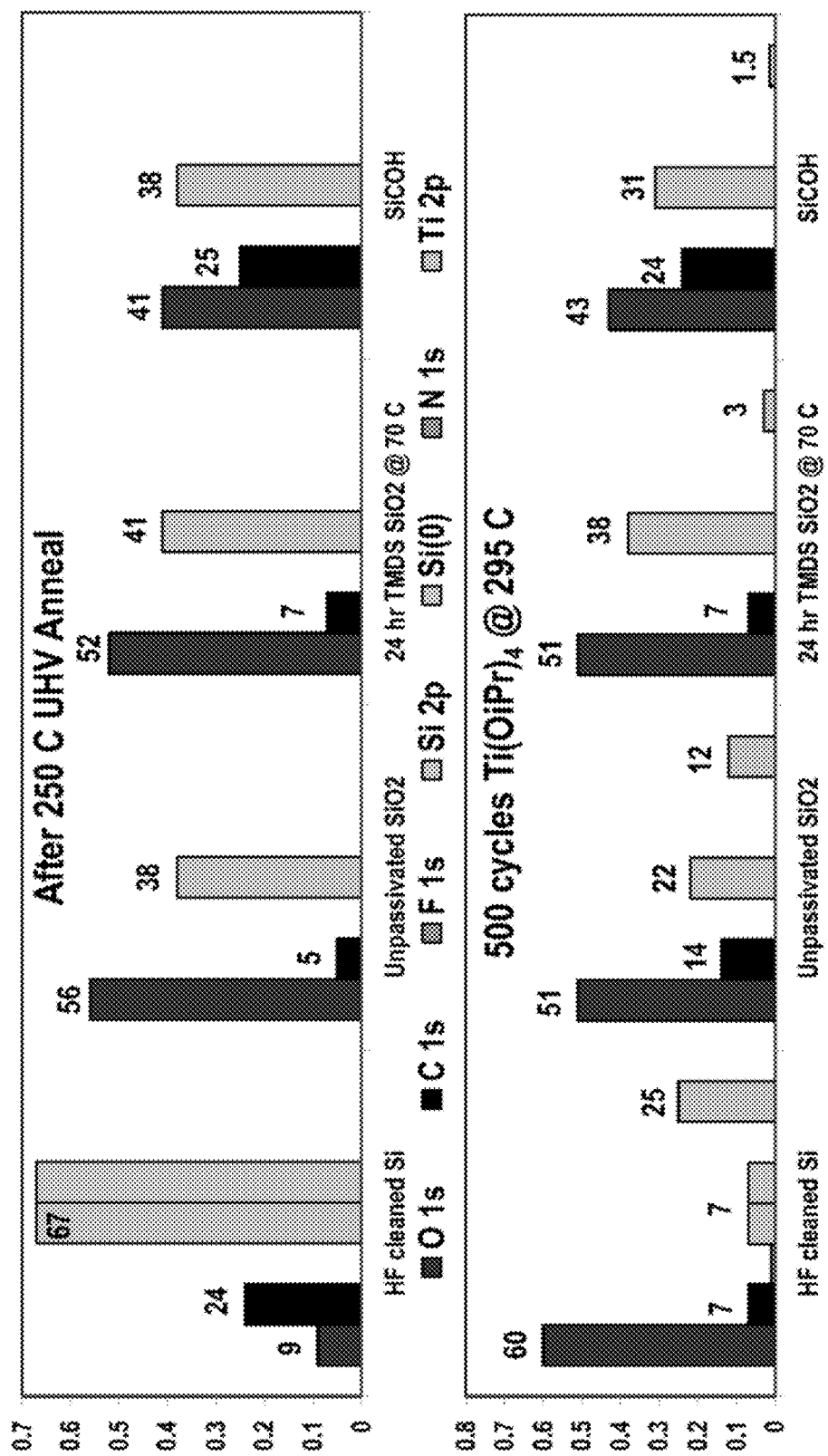
FIG. 17: XPS analysis of selective $TiO_2$ ALD on Si over TMDS-passivated $SiO_2$ compared to unpassivated $SiO_2$ and SiCOH.

Selective self-limiting CVD of $TiO_2$ was performed on both passivated and unpassivated $SiO_2$, as well as the low-k methyl-terminated dielectric SiCOH, and compared with deposition of $TiO_2$ on HF cleaned Si. After 500 cycles of $Ti(OiPr)_4$ at 295° C., it was observed that $TiO_2$ deposition on Si proceeds readily (25% Ti). On unpassivated $SiO_2$, hydroxyls are moderately reactive to $Ti(OiPr)_4$, allowing some deposition to proceed (12% Ti). The low-k methyl-terminated dielectric SiCOH is very effective at suppressing $TiO_2$ deposition as shown XPS (1.5% Ti). TMDS-passivated $SiO_2$ has a methyl-terminated surface, and exhibits a similar inertness to $TiO_2$ deposition as SiCOH. See, FIGS. 11 and 17.

In the foregoing, it has been demonstrated that: passivation of hydroxyl groups on $SiO_2$ can be achieved using ethoxysilanes and disilazanes; selective ALD of $MoSi_x$ on Si over $SiO_2$ is enhanced by the passivation of hydroxyl groups; TMDS results in more effective passivation than HMDS at lower passivation temperatures; and passivation by TMDS enhances the selectivity of self-limiting CVD of $TiO_2$. Additional steps may include dosing the passivant in the vapor phase, and providing a P-containing disilazane for rapid SAM passivation.

While specific embodiments of the present inventive concept have been shown and described, the foregoing is illustrative of the present inventive concept and is not to be construed as limiting thereof. It should be understood that other modifications, substitutions and alternatives are apparent to one of ordinary skill in the art. Such modifications, substitutions and alternatives can be made without departing from the spirit and scope of the inventive concept.

The inventive concept is defined by the following claims, with equivalents of the claims to be included therein.

That which is claimed:

1. A method for selectively depositing a metal, metal nitride, metal oxide, or metal silicide layer on a substrate, the substrate comprising a surface, the surface comprising: an SiO2 layer portion comprising hydroxyl groups on $SiO_2$; and a metal or metal oxide portion, the method comprising:
   a) pre-treating the SiO2 layer portion of the surface, wherein the pre-treating cleans and renders the SiO2 layer portion of the surface hydrophilic;
   b) exposing the surface to a passivant for a period of time between about 2 hours and less than about 24 hours at a temperature of about 200° C. or below that renders the surface of the SiO2 layer portion of the surface hydrophobic;
   c) annealing the substrate at a temperature of about 300° C. or above to selectively passivate the SiO2 layer portion of the surface over the metal or metal oxide portion of the surface, wherein the passivant binds selectively to —OH or O on the SiO2 layer portion over the metal or metal oxide portion above about 300° C., wherein the passivant is selectively bound to the SiO2 portion of the surface over the metal or metal oxide portion of the surface, and wherein the metal or metal oxide of the surface is unpassivated and/or has characteristics of an unpassivated surface after the substrate is annealed; and
   d) selectively growing the metal, metal nitride, metal oxide, or metal silicide layer on the metal or metal oxide portion of the surface,
   wherein the passivant enhances selective growth of the metal, metal nitride, metal oxide, or metal silicide layer on the metal or metal oxide portion of the surface over the SiO2 layer portion of the surface, and wherein the metal, metal oxide, metal nitride, or metal silicide layer is grown by atomic layer deposition (ALD), and wherein the passivant is tetramethyldisilazane (TMDS).

2. The method of claim 1, wherein the substrate is annealed in an ultra-high vacuum (UHV) after the substrate is exposed to the passivant.

3. The method of claim 1, wherein the metal or metal oxide portion of the surface of the substrate comprises W, Cu, or Co.

4. The method of claim 1, wherein the metal, metal nitride, metal oxide, or metal silicide layer grown is molybdenum silicide, titanium dioxide, or hafnium dioxide.

5. The method of claim 1, wherein exposing the oxide layer portion of the surface of the substrate to the passivant comprises exposing the oxide layer portion of the surface of the substrate to a solution comprising the passivant.

6. The method of claim 1, wherein the surface is exposed to the passivant at a temperature between about 70° C. and about 100° C.

7. A method for selectively depositing a molybdenum silicide $TiO_2$ layer on a substrate, the substrate comprising a surface, the surface comprising: a $SiO_2$ portion; and a Cu or Co portion, the method comprising:
   a) pre-treating the $SiO_2$ portion of the surface, the $SiO_2$ portion of the surface comprising hydroxyl groups, wherein the pre-treating renders the $SiO_2$ portion of the surface hydrophilic;
   b) exposing the $SiO_2$ portion of the surface to a passivant for a period of time of less than about 24 hours at a temperature of about 200° or below that renders the surface of the $SiO_2$ portion of the surface hydrophobic;
   c) annealing the substrate at a temperature of about 300° C. or above to selectively passivate the $SiO_2$ portion of the surface over the Cu or Co portion of the surface, wherein the passivant is selectively bound to the $SiO_2$ portion of the surface over the Cu or Co portion of the surface, and wherein the Cu or Co portion of the surface is unpassivated and/or has characteristics of an unpassivated surface after the substrate is annealed; and
   d) selectively growing the molybdenum silicide or $TiO_2$ layer on the Cu or Co portion of the surface,
   wherein the passivant enhances selective growth of the molybdenum silicide or $TiO_2$ layer on the Cu or Co portion of the surface over the $SiO_2$ portion of the surface, wherein the molybdenum silicide or $TiO_2$ layer is grown by atomic layer deposition (ALD), and wherein the passivant is tetramethyldisilazane (TMDS).

8. The method of claim 7, wherein the substrate is annealed in an ultra-high vacuum (UHV) after the substrate is exposed to the passivant.

9. The method of claim 7, wherein exposing the $SiO_2$ portion of the surface to the passivant comprises exposing the $SiO_2$ portion of the surface to a solution comprising the passivant.

10. The method of claim 7, wherein the surface is exposed to the passivant for a period of time between about 2 hours and about 24 hours.

\* \* \* \* \*

UNITED STATES PATENT AND TRADEMARK OFFICE
CERTIFICATE OF CORRECTION

PATENT NO. : 11,993,844 B2
APPLICATION NO. : 16/857335
DATED : May 28, 2024
INVENTOR(S) : Wolf et al.

Page 1 of 1

It is certified that error appears in the above-identified patent and that said Letters Patent is hereby corrected as shown below:

In the Claims

Column 10, Line 51-52 Claim 1:
Please correct "selectively bound to the SiO2 portion"
To read -- selectively bound to the SiO2 layer portion --

Signed and Sealed this
Twenty-third Day of July, 2024

Katherine Kelly Vidal
*Director of the United States Patent and Trademark Office*